United States Patent
Lutz et al.

(10) Patent No.: US 7,518,203 B2
(45) Date of Patent: Apr. 14, 2009

(54) SEMICONDUCTOR STRUCTURE, PARTICULARLY IN A SEMICONDUCTOR DETECTOR, AND ASSOCIATED OPERATING METHOD

(75) Inventors: Gerhard Lutz, München (DE); Rainer Richter, München (DE); Lothar Strueder, München (DE)

(73) Assignee: Max-Planck-Gesellschaft zur Forderung der Wissenschaften, Munich (DE)

( * ) Notice: Subject to any disclaimer, the term of this patent is extended or adjusted under 35 U.S.C. 154(b) by 171 days.

(21) Appl. No.: 11/757,664

(22) Filed: Jun. 4, 2007

(65) Prior Publication Data

US 2008/0001180 A1    Jan. 3, 2008

(30) Foreign Application Priority Data

Jun. 29, 2006  (EP)  ................................. 06013518
Aug. 11, 2006  (EP)  ................................. 06016860

(51) Int. Cl.
*H01L 31/08*  (2006.01)

(52) U.S. Cl. ..................... 257/429; 257/459; 257/228; 257/E31.054

(58) Field of Classification Search ................. 257/113, 257/257, 447, 448, 459, 460, 462, E31.053, 257/E31.054, E31.079, E31.085, E31.091, 257/E31.092

See application file for complete search history.

(56) References Cited

U.S. PATENT DOCUMENTS 4,885,620 A    12/1989  Kemmer et al.
6,249,033 B1 *  6/2001  Castoldi et al. ............. 257/429
2005/0173733 A1  8/2005  Struder et al.
2008/0230811 A1 *  9/2008  Lechner et al. ............. 257/257

FOREIGN PATENT DOCUMENTS

| DE | 3427476 A1 | 10/1985 |
| DE | 10213812 A1 | 10/2003 |
| DE | 102004004283 A1 | 8/2005 |
| WO | 2005074012 A2 | 8/2005 |

OTHER PUBLICATIONS

Lutz, "Semiconductor Radiation Detectors", pp. 125-126, Springer-Verlag, (1999).
Struder, "High-resolution imaging x-ray spectrometers", Nuclear Instruments and Methods in Physics Research A, vol. 454 (2000).

* cited by examiner

*Primary Examiner*—Matthew C Landau
*Assistant Examiner*—Vongsavanh Sengdara
(74) *Attorney, Agent, or Firm*—Caesar, Rivise, Bernstein, Cohen & Pokotilow, Ltd.

(57) ABSTRACT

Semiconductor detector includes semiconductor substrate (HK), source region (S), drain region (D), external gate region (G) and inner gate region (IG) for collecting free charge carriers generated in semiconductor substrate, wherein inner gate region is arranged in semiconductor substrate at least partially under external gate region to control conduction channel (K) from below as a function of the accumulated charge carriers, as well as with clear contact (CL) for the removal of the accumulated charge carriers from inner gate region, as well as with drain-clear region (DCG) that can be selectively controlled as an auxiliary clear contact or as a drain. Barrier contact (B) is arranged in a lateral direction between external gate region and drain-clear region to build up a controllable potential barrier between inner gate region and clear contact that prevents the charge carriers accumulated in inner gate region from being removed by suction from clear contact.

17 Claims, 4 Drawing Sheets

SEMICONDUCTOR STRUCTURE, PARTICULARLY IN A SEMICONDUCTOR DETECTOR, AND ASSOCIATED OPERATING METHOD

BACKGROUND OF THE INVENTION

The invention relates to a semiconductor structure, particularly in a semiconductor detector, as well as to an associated operating method.

Semiconductor drift detectors for the detection of radiation have been known for some time and are described, e.g., in LUTZ, Gerhard: "Semiconductor Radiation Detectors", Springer-Verlag (1999), STRÜDER, Lothar: "Nuclear Instruments and Methods in Physics Research A", volume 454 (2000) and DE 34 27 476 A1, DE 102 13 812 A1 as well as DE 10 2004 004 283 A1. Here, the radiation to be detected generates signal electrons in a weakly doped, depleted semiconductor substrate and several ring-shaped and concentrically arranged electrodes are arranged on a surface of the semiconductor substrate that generate a drift field in the semiconductor substrate through which the signal electrons generated by the radiation drift to a centrally arranged readout element that detects the signal electrons and therewith the received radiation.

The readout element can consist here of a DEPFET transistor (DEPFET—Depleted Field Effect Transistor) which was invented in 1984 by J. KEMMER and G. LUTZ and is described, e.g., in DE 10 2004 004 283 A1.

Such a DEPFET transistor can comprise a weakly n-doped, depleted semiconductor substrate, a strongly p-doped back electrode being arranged on a surface of the semiconductor substrate that forms a diode poled in the reverse direction with the weakly n-doped semiconductor substrate and serving to deplete the semiconductor substrate, and holes produced in the semiconductor substrate by the action of radiation are removed by suction via the back electrode from the semiconductor substrate.

A strongly p-doped source region and a likewise strongly p-doped drain region are located on the opposite surface of the semiconductor substrate in a DEPFET transistor as readout element, and a conduction channel can develop between the source region and the drain region whose conductivity can be adjusted by an externally controllable gate electrode.

A weakly n-doped inner gate region is located below the conduction channel in the semiconductor substrate in which region the signal electrons produced in the semiconductor substrate by the action of radiation accumulate. The electrical charge accumulated in the inner gate region controls the conductivity of the conduction channel between the source region and the drain region in a manner similar to that of the external gate electrode so that the drain-source current is a measure for the detected radiation.

However, the signal electrons accumulated in the inner gate region must occasionally be removed from the inner gate region in order to preserve the sensitivity of the drift detector. To this end a separate clear contact is provided in the known DEPFET that is arranged, e.g., on the source side adjacent to the actual DEPFET transistor and removes by suction the signal electrons accumulated in the inner gate region by applying a positive electrical voltage.

In the previously described known semiconductor detector the drain-source current of the DEPFET transistor used as readout element is therefore a measure for the quantity of the signal charge that was produced by the radiation to be detected in the semiconductor substrate and which is accumulated in the inner gate region of the DEPFET transistor.

However, in order to measure the radiation, the drain-source current need not be directly measured when the signal charge generated by the radiation to be detected arrives in the inner gate region of the DEPFET transistor, but rather it is sufficient for measuring the radiation if the drain-source current of the DEPFET transistor is measured at the beginning of a measuring time period and at the end of a measuring time period, wherein the DEPFET transistor can be switched off before, after and between the two measurements. Then, the radiation incident during the measuring time period follows from the difference of the two drain-source currents at the beginning and at the end of the measuring time period. It is appropriate here on account of the electronic noise to perform the two successive measurements of the drain-source current in the shortest possible time interval. However, this is difficult, e.g., in the case of a semiconductor detector with a plurality of picture elements since the individual picture elements of the semiconductor detector are read out sequentially in this case so that a given readout cycle time is present between two successive measurements of the drain-source current that depends on the number of the picture elements and the duration of the individual measuring procedures. This problem is posed, e.g., in applications in adaptive optics and on the so-called XFEL (X-Ray Free Electron Laser).

This problem can be solved in that in a readout procedure at first the drain-source current is measured with charge accumulated in the inner gate region, the inner gate region is subsequently completely emptied and the drain-source current is then measured again with the inner gate region being emptied. Finally, the difference of the two measured drain-source currents is then calculated as a measure for the radiation to be detected.

However, in this measuring method the first measurement not only reproduces the signal charge that was produced by the radiation to be detected in the semiconductor substrate and which is accumulated in the inner gate region, but rather the first measurement of the drain-source current also contains a disturbance signal that stems from the thermally generated charge ("dark current") as well as from scattered light from other objects and which falsifies the radiation measurement.

Furthermore, radiation events are frequently observed whose exact point in time is known a priori. This is the case, e.g., in experiments with particle accelerators in which the particle beam has a regular, pulse-shaped time structure. It is desirable in these measurements to limit the sensitivity of the semiconductor detector to a given time window in which the radiation event of interest takes place. The time range between the individual radiation events can then be used to read out the measured signal charges.

The previously described known semiconductor detectors with a DEPFET transistor as a readout element therefore have the disadvantageous fact that the sensitivity of the semiconductor detector can not be limited in time relative to disturbance signals such as, e.g., thermally generated charge or scattered light from other objects without also clearing the signal charge carriers accumulated in the inner gate region that stem from the radiation of interest.

It is therefore an object of the invention to create a semiconductor detector that can be switched insensitive without clearing the signal charge carriers accumulated in the inner gate region.

SUMMARY OF THE INVENTION

This problem is solved by the invention in that a barrier contact is additionally provided in a known semiconductor structure according to DE 10 2004 004 283 A1, which is arranged on the front side of the semiconductor substrate in the lateral direction between the external gate region of the DEPFET transistor and the drain-clear region in order to build up a controllable potential barrier in the semiconductor substrate between the inner gate region and the clear contact which barrier prevents the charge carriers accumulated in the gate region from being removed by suction from the clear contact.

The barrier contact advantageously makes it possible to switch the semiconductor detector into an insensitive state in which a positive potential on the clear contact removes signal electrons from the semiconductor substrate that were thermally generated or stemmed from disturbing scattered light, and a negative potential on the barrier contact in accordance with the invention between the clear contact and the inner gate region builds up a potential barrier that prevents the positive potential of the clear contact from removing by suction the signal charge carriers accumulated in the inner gate region. Therefore, in this insensitive state of the semiconductor detector the signal charge accumulated in the inner gate region of the DEPFET transistor is stored, in contrast to which newly regenerated signal charge carriers are removed by suction from the clear contact and therefore do not pass into the inner gate region.

The semiconductor detector in accordance with the invention is therefore particularly advantageously suitable for measuring short-time radiation events such as, e.g., in the previously mentioned experiments with particle accelerators in which the particle beam has a regular pulse-shaped time structure. In order to measure the radiation in a narrowly limited time window the semiconductor detector in accordance with the invention is then first cleared in a traditional manner in that the signal charge carriers accumulated in the inner gate region are removed by suction via the clear contact. Subsequently, the semiconductor detector in accordance with the invention is then switched insensitive up to the beginning of the measuring time period of interest in order to prevent thermally generated charges ("dark current") or disturbing scattered light from falsifying the radiation measurement in the meanwhile. At the beginning of the measuring time period of interest the semiconductor detector in accordance with the invention is then switched into a sensitive state, which can take place in a traditional manner as described in patent application DE 10 2004 004 283 A1 already mentioned initially. After the expiration of the measuring time period of interest the semiconductor detector in accordance with the invention is then read out in a traditional manner and the measured drain-source current renders the signal charge accumulated in the inner gate region of the DEPFET transistor. The semiconductor detector in accordance with the invention is then preferably cleared again in that a positive potential is applied in a traditional manner to the clear contact so that the signal charge carriers accumulated in the inner gate region are removed by suction. Finally, another measurement of the drain-source current then takes place with an empty inner gate region. The radiation incident during the measuring time period of interest then results from the difference of the two drain-source currents.

In a preferred exemplary embodiment of the invention the source region of the DEPFET transistor is surrounded by the external gate region and by the inner gate region arranged below it. In the semiconductor structure in accordance with the invention, the DEPFET transistor is therefore preferably ring-shaped and the source region is arranged inside.

Moreover, the external gate region is preferably surrounded by the barrier contact in accordance with the invention. Thus, even the barrier contact is preferably ring-shaped and the external gate region and the source region are arranged inside the ring-shaped barrier contact.

Furthermore, the barrier contact is preferably surrounded by the drain-clear region so that even the drain-clear region is ring-shaped, and the barrier contact, the external gate region and the source region are arranged inside the drain-clear region. The concept of being ring-shaped used in the framework of the invention is to be understood in a general manner and is not limited to circular structures but rather also comprises oval and polygonal structures that can be, e.g., rectangular, quadratic or hexagonal. The manner of functioning and the control of the drain-clear region have already been described in detail in patent application DE 10 2004 004 283 A1 already previously mentioned so that the content of this patent application is incorporated herein to the full extent as regards the manner of functioning and the control of the drain-clear region. However, it should be mentioned that given a sufficiently negative potential, the drain-clear region puts the potential of the drain region through to the drain end of the conduction channel and the current running from the source region to the drain region can then be controlled by the external gate region and by the signal charge accumulated in the inner gate region. The transistor current is then a measure for the signal charge located in the inner gate region. On the other hand, given a more positive potential on the drain-clear region, no conduction channel is present between the source region and the drain region of the DEPFET transistor so that also no drain-source current flows. The drain-clear region can therefore be used together with the barrier region in accordance with the invention for switching between the following operating types of the semiconductor structure in accordance with the invention:

State I: Reading out, i.e. measuring the drain-source current in order to determine the signal charge accumulated in the inner gate region.

State II: Sensitive state in which the drain-source current is suppressed by the external gate region and signal charges can accumulate in the inner gate region.

State III: Insensitive storage state in which the signal charge accumulated in the inner gate region remains preserved, in contrast to which newly generated signal charge carriers are removed by suction from the clear contact.

State IV: Clearing of the semiconductor structure, during which the signal charge carriers accumulated in the inner gate region are removed by suction from the clear contact.

Due to the additional barrier contact, the invention therefore makes the previously described insensitive storage state ("state III") possible for the first time.

In an exemplary embodiment of the invention, the drain region is connected in an electrically conductive manner at least one location to a region below the barrier contact.

Furthermore, in an exemplary embodiment the clear contact and the drain region comprise several sub-regions that are alternately arranged in the circumferential direction in the outer zone of the ring-shaped semiconductor structure. Intermediate spaces are preferably arranged between the adjacent zones of the clear contact on the one hand and of the drain region on the other hand in order to avoid field strength peaks.

Furthermore, in the preferred exemplary embodiment of the invention a first shielding region is provided that is arranged in the semiconductor substrate at least partially below the inner gate region and/or below the source region. This first shielding region should prevent in the novel insensitive storage state that signal charge carriers generated below the inner gate region pass into the inner gate region on account of the immediate vicinity to the inner gate region and are accumulated there. Instead of this, the first shielding region below the inner gate region brings it about that even such charge carriers that are generated in the insensitive storage state of the semiconductor structure below the inner gate region are removed by suction from the clear contact.

The first shielding region covers the inner gate region in a lateral direction here preferably only partially. The first shielding region therefore preferably comprises a lesser lateral extent than the inner gate region. This is appropriate in order that signal charge carriers that are generated in the sensitive state of the semiconductor structure below the inner gate region can pass laterally past the first shielding region into the inner gate region.

Furthermore, the semiconductor structure in accordance with the invention preferably comprises a second shielding region that is arranged in the semiconductor substrate at least partially below the clear contact and correspondingly shields the clear contact.

Moreover, there is the possibility within the framework of the invention that the inner gate region is arranged partially below the source region and is doped according to another doping type than the source region, wherein the source region with its doping extends into the inner gate region and as a result partially compensates its opposed doping. As a result, a potential barrier is built up in the inner gate region below the source region which barrier laterally eliminates the one in the inner gate region so that the signal charge carriers are concentrated in the inner gate region below the conduction channel between the source region and the drain region and as a result thereof better control the conduction channel.

It should furthermore be mentioned that silicon is preferably used as semiconductor material. However, the invention is not limited to silicon as concerns the semiconductor material to be used but can also be realized with other semiconductor materials.

In addition, even other insulating and conductor materials can be used in the semiconductor structure in accordance with the invention.

It is self-evident that the previously mentioned drain-clear region is preferably a MOS region.

In addition, it is clear to an expert in the art that the semiconductor structure in accordance with the invention can belong to the depletion type, in which instance an additional channel implantation is provided.

However, it is also alternatively possible that the semiconductor structure belongs to the enrichment type, in which instance no additional channel implantation must take place.

Furthermore, the previously mentioned drain-clear region can have an implantation of the first doping type below it that is close to the surface or buried.

The additional buried implantation (e.g., an n-doping) approximately at the depth of the inner gate region permits an electron transport at a distance to the surface. This is advantageous because disturbance spots close to the surface can hinder the electron transport.

The additional doping close to the surface brings about a shifting of the voltages necessary for the operation of the semiconductor structure on the drain-clear region as a result of which the latter can be brought into a more favorable zone. This is especially necessary in the case of enrichment types since otherwise the positive charges occurring in the case of silicon in the current-carrying state require a high negative voltage on the drain-clear region. It is naturally also possible in the framework of the invention to provide an analogous measure for the external gate region.

The external gate region, the barrier contact in accordance with the invention and/or the drain-clear region can consist, e.g., of polysilicon or metal; however, the invention can also be realized in another way.

It should furthermore be mentioned that the semiconductor substrate is preferably weakly doped in accordance with a first doping type or in accordance with a second doping type.

It should furthermore be noted that the external gate region, the source region, the drain region, the clear contact and the barrier contact can be controlled in an electrically separated manner in the preferred exemplary embodiment of the semiconductor structure in accordance with the invention.

The first doping type can be, e.g., an n-doping whereas the second doping type is formed by a p-doping.

However, it is also alternatively possible that the first doping type is a p-doping in contrast to which the second doping type is an n-doping.

The drain region and the source region are preferably highly doped in accordance with the second doping type, which is preferably a $p^+$-doping.

On the other hand, the inner gate region is preferably doped in accordance with the first doping type, which is preferably an $n^-$-doping.

On the other hand, the clear contact is preferably arranged in the semiconductor substrate on its front side and highly doped in accordance with the first doping type, which is preferably an $n^-$-doping.

On the other hand, the two above-mentioned shielding regions for shielding the inner gate region and the clear contact are preferably doped in accordance with the second doping type, which is preferably a p-doping.

Furthermore, a region of the second doping type is preferably arranged on the back side of the semiconductor substrate in order to deplete the semiconductor substrate, which region is preferably p-doped.

It should furthermore be mentioned that the invention not only claims protection for a complete semiconductor detector but is also directed to a semiconductor structure that has the features of the invention and can be used in a semiconductor detector.

Moreover, the invention also comprises a corresponding operating method for a semiconductor detector as results already from the previous description of the semiconductor detector in accordance with the invention and is described again in the following.

In a step of the operating method in accordance with the invention, a detection of radiation takes place in a sensitive state of the semiconductor detector, wherein the radiation generates signal charge carriers in the semiconductor substrate of the semiconductor detector that accumulate in the inner gate region in the semiconductor substrate.

On the other hand, in a further step a measuring of the signal charge carriers accumulated in the inner gate region takes place as a measure for the detected radiation.

A further step of the operating method in accordance with the invention provides that the signal charge carriers accumulated in the inner gate region are removed by suction by a clear contact.

The previously described steps are already known from patent application DE 10 2004 004 283 A1, so that as concerns the technical realization of these steps the previously cited patent application is referred to, which is therefore to be ascribed to the full extent to the present description.

Moreover, the operating method in accordance with the invention comprises an additional step in which an insensitive state of the semiconductor detector is adjusted in which signal charge carriers generated by the radiation are removed via the clear contact whereas the signal charge carriers already accumulated in the inner gate region remain preserved there. Therefore, this state provided in accordance with the invention is an insensitive storage state.

A potential barrier between the inner gate region and the clear contact is preferably generated in the insensitive state of the semiconductor detector provided in accordance with the invention by the barrier contact which potential barrier prevents the signal charge carriers accumulated in the inner gate region from being removed by suction from the clear contact. In order to generate this potential barrier a negative potential is applied to the barrier contact in the insensitive state whereas on the other hand the potential of the barrier contact for clearing the signal charge carriers accumulated in the inner gate region is shifted in a positive direction in order to break down the potential barrier for clearing and as a result to make possible a removal by suction of the charge carriers accumulated in the inner gate region by the clear contact.

When measuring the charge carriers accumulated in the inner gate region a current through a conduction channel between a source region and a drain region is preferably measured in accordance with the state of the art which measured current is controlled by the signal charge carriers accumulated in the inner gate region and by the external gate region.

In the sensitive state, such a potential is applied to the external gate region that the current through the conduction channel is blocked, which, however, is also known from the state of the are in accordance with DE 10 2004 004 283 A1. This blocking of the conduction channel in the sensitive state improves the sensitivity of the detector. However, it is basically also possible that the conduction channel is conductive in the sensitive state.

For clearing and in the insensitive state of the semiconductor detector provided for the first time in accordance with the invention, a positive potential is applied to the clear contact that removes by suction the signal charge carriers being produced in the semiconductor substrate.

The switching between the insensitive state of the semiconductor detector provided for the first time in accordance with the invention and between the known sensitive state of the semiconductor detector preferably takes place by a suitable electrical control of the drain-clear region, wherein the drain-clear region selectively makes possible the discharge of generated signal charges to the clear contact or the formation of an inversion layer connected to the drain region. In the sensitive state, the drain-clear region therefore preferably has a negative potential whereas the drain-clear region in the insensitive state provided for the first time in accordance with the invention is preferably controlled with a positive potential.

Furthermore, it should be mentioned that the invention is not limited to ring-shaped structures but rather also comprises linear structures that therefore also fall within the scope of protection.

BRIEF DESCRIPTION OF THE DRAWINGS

Other advantageous further developments of the invention are explained in detail in the following together with the description of preferred exemplary embodiments of the invention using the figures.

DETAILED DESCRIPTION OF PREFERRED EMBODIMENTS

Figure 1A:
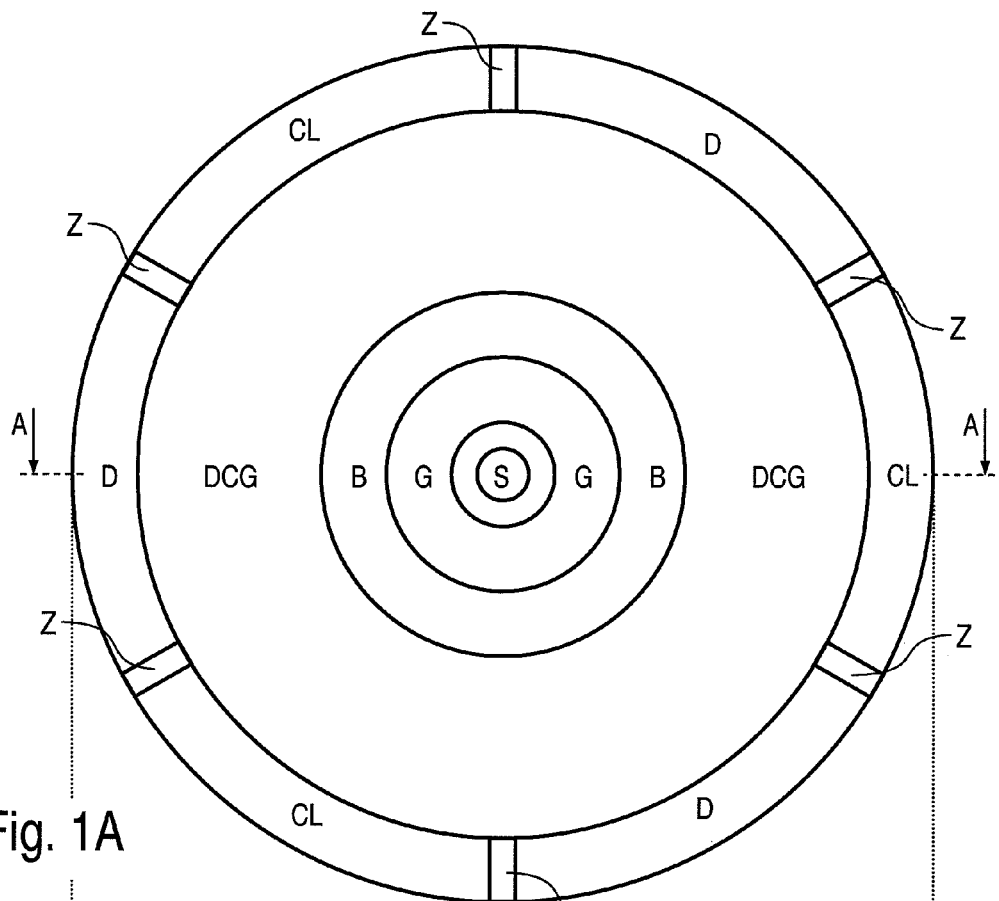
FIG. 1A shows a top view of a semiconductor structure in accordance with the invention.
Figure 1B:
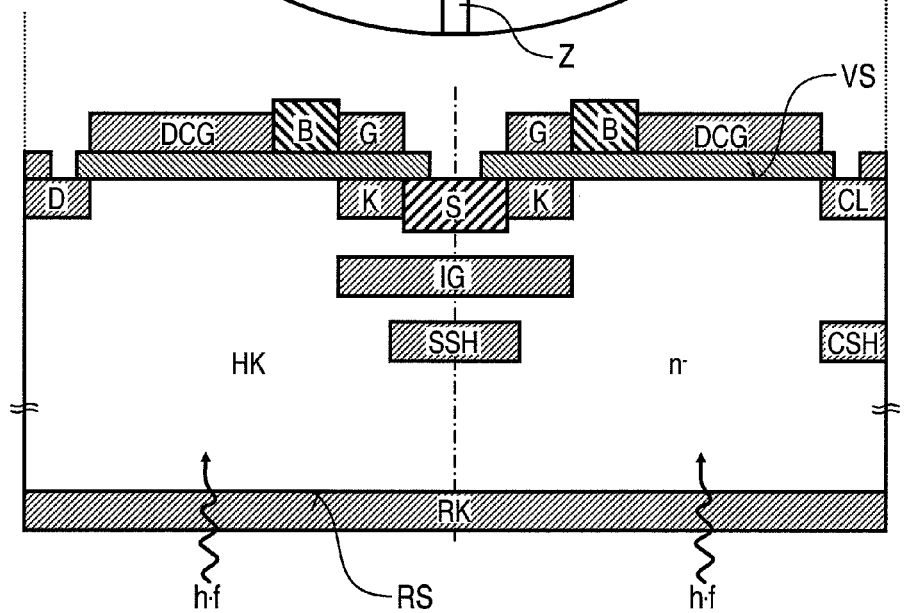
FIG. 1B shows a cross-sectional view of the semiconductor structure in accordance with FIG. 1A.

The DEPFET structure shown in FIGS. 1A and 1B can be used as a readout element in a drift detector like the one described, e.g., in STRÜDER, Lothar: "Nuclear Instruments and Methods in Physics Research A", volume 454 (2000), in LUTZ, Gerhard: "Semiconductor Radiation Detectors", Springer-Verlag (2001) and in DE 34 27 476 A1, so that the content of these publications is to be ascribed to the full extent to the following description.

The DEPFET structure in accordance with the invention comprises a weakly n-doped plate-shaped semiconductor body HK that can have a thickness of, e.g., 300 µm. An plane electrode RK is arranged on a back side RS, located at the bottom in the drawing, of the semiconductor body HK and consists of a strongly p-doped region, wherein the electrode RK forms a diode poled in the reverse direction with the semiconductor body HK and serves to deplete the semiconductor body HK. Therefore, in the operation of the DEPFET structure a negative electrical potential is applied to the electrode RK in order to remove free electrons from the semiconductor body HK and to deplete the semiconductor body HK as a result thereof.

A transistor structure with a strongly p-doped source region S and a likewise strongly p-doped drain region D is located on an opposite front side VS of the semiconductor body HK, a conduction channel K being located between the source region S and the drain region D, the conductivity of which conduction channel can be controlled by an external gate region G in that an appropriate electrical potential is applied to the external gate region G. The external gate region G is directly arranged here above the conduction channel K in order that the conductivity of the conduction channel K can be controlled as well as possible by the external gate region G.

In addition, a buried, n-doped inner gate region IG is located in the semiconductor body HK below the conduction channel K in which inner gate region IG signal electrons accumulate that are produced due to a radiation effect to be detected in the semiconductor body HK. The signal electrons accumulated in the inner gate region IG control the conductivity of the conduction channel K in a manner similar to that of an electrical control signal applied to the external gate region G so that the conductivity of the conduction channel K is a measure for the signal charge carriers accumulated in the inner gate region IG and therewith for the incident radiation.

However, the inner gate region IG has only a limited absorption capacity for the signal electrons produced by the action of radiation and must therefore be occasionally re-emptied in order to maintain the sensitivity of the entire DEPFET structure. To this end a clear contact CL is provided consisting of a strongly n-doped region on the front side VS of the semiconductor body HK.

The drain region D and the clear contact CL each consist of three circular segmented regions distributed alternately arranged in the outer zone of the semiconductor structure over its circumference, as is apparent from FIG. 1A. Intermediate spaces Z are arranged between the adjacent zones of the clear contact CL on the one hand and of the drain region D on the other hand which spaces Z should avoid field strength peaks at the joint regions between the clear contact CL and the drain region D.

The already previously mentioned strong p-doping of the source region S acts deep into the inner gate region IG and has the consequence that the signal electrons accumulated in the inner gate region IG are concentrated below the conduction channel K and not below the source region S. This is appropriate since the electrons located below the source region S in the inner gate region IG do not contribute or contribute only slightly to the controlling of the conductivity of the conduction channel K.

Furthermore, the semiconductor structure has a drain-clear region DCG that is arranged on the front side VS of the semiconductor body HK and surrounds the external gate region G in a ring-like manner. The drain-clear region DCG can selectively support the clearing of the inner gate region IG by the clear contact CL or serve as an additional drain region depending on its electrical control. Given sufficient negative voltage on the drain-clear region DCG, the drain-clear region assumes the function of the drain whereas given sufficient positive voltages on the drain-clear region DCG and on the clear contact CL, it makes possible the clearing of the signal electrons stored in the inner gate region IG.

A particularity of the invention consists in an additional barrier contact B that is arranged in a ring-shaped manner between the drain-clear region DCG and the external gate region G and which makes it possible to adjust a sensitive storage state of the semiconductor structure in which the signal electrons being produced in the semiconductor body HK are removed by suction from the clear contact CL whereas the signal electrons accumulated in the inner gate region IG remain preserved. To this end a negative potential is applied to the barrier contact B that extends out into the semiconductor body HK and generates a potential barrier between the inner gate region IG and the clear contact CL that prevents the signal electrons accumulated in the inner gate region IG from being removed by suction from the positive potential of the clear contact CL.

Figure 2:
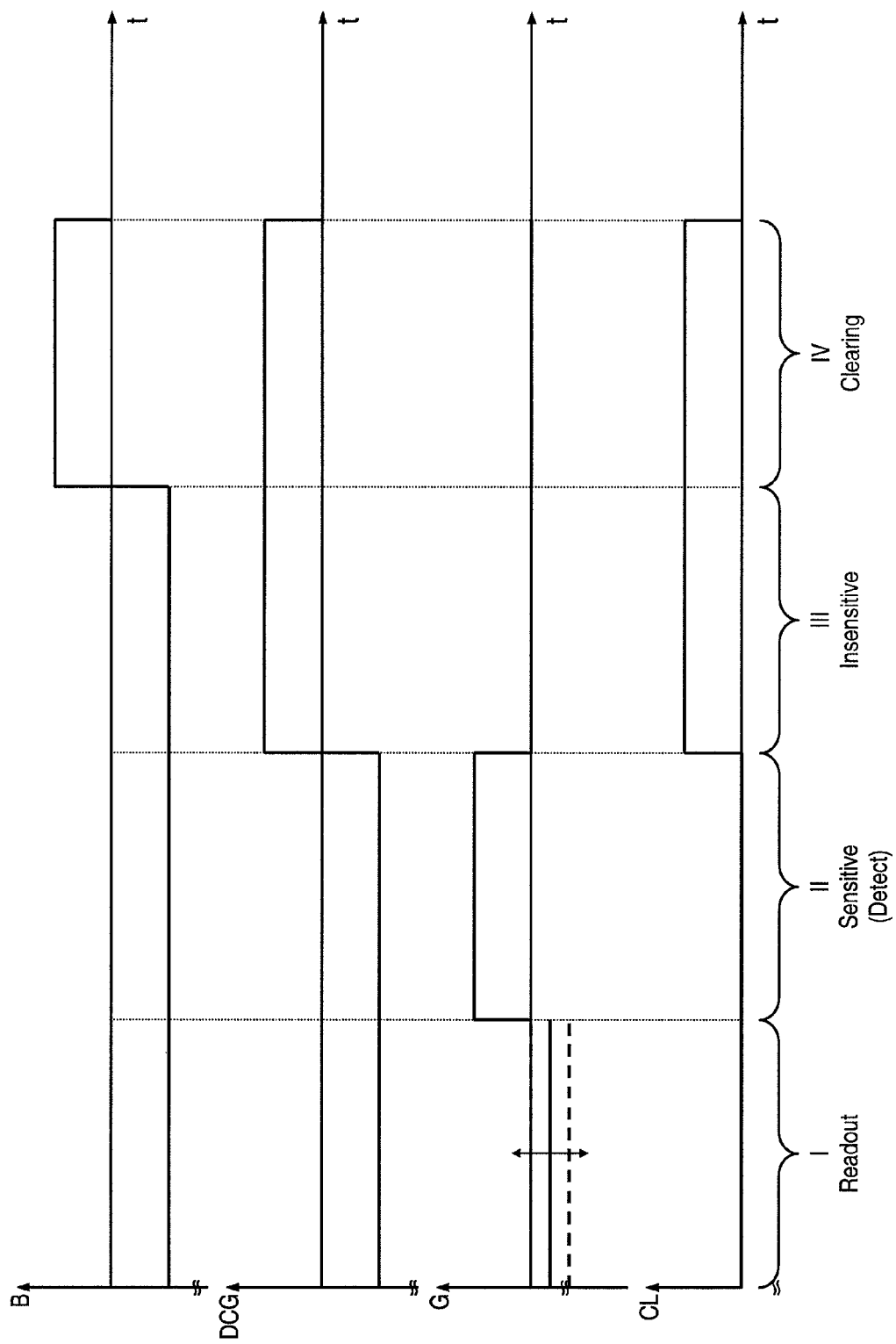
FIG. 2 shows a time diagram that illustrates the control of the barrier contact, of the drain-clear region, of the external gate region and of the clear contact.

FIG. 2 shows the different operating states of the semiconductor structure in accordance with FIGS. 1A and 1B in which the electrical potentials of the barrier contact B, the drain-clear region DCG, the external gate region G and of the clear contact CL are qualitatively represented. It is pointed out by way of precaution that this concerns only a qualitative representation of the electrical potentials since the actual potentials depend among other things on the doping strength and the geometric dimensions.

The semiconductor detector can be read out in a state I. during which the charge accumulated in the inner gate region IG is determined. To this end a negative potential is applied to the barrier contact B and to the drain-clear region. As a result, an inversion layer forms under them that extends from the drain region D to the conduction channel K under the external gate region G. The potential of the drain region D is then put through to the drain end of the conduction channel K and the current running from the source region S to the drain region D can be controlled by the external gate region G and the signal charge accumulated in the inner gate region IG, as indicated by the arrow. The drain-source current is a measure here for the charge located in the inner gate region IG.

On the other hand, in a sensitive state II., the semiconductor detector detects the incident radiation. To this end a negative potential is applied to the barrier contact B and to the drain-clear region DCG. On the other hand, in the sensitive state the external gate region G is controlled with a positive potential in order to suppress the drain-source current. In this state the signal charge carriers generated in the semiconductor body HK accumulate in the inner gate region IG.

Furthermore, the semiconductor detector in accordance with the invention makes a third state III. possible, in which the semiconductor detector is insensitive. In this state a positive potential is applied to the clear contact CL in order to remove by suction the free charge carriers generated in the semiconductor body HK by scattered light or thermal processes to the clear contact. On the other hand, in the insensitive state of the semiconductor detector a negative potential is applied in order to build up a potential barrier between the inner gate region IG and the clear contact CL that prevents the positive potential of the clear contact CL from removing by suction the signal electrons accumulated in the inner gate region IG. In this insensitive state a positive potential is also applied to the drain-clear region DCG so that no drain-source current can flow between the source region S and the drain region D.

Finally, the semiconductor detector in accordance with the invention also makes a conventional state IV. possible in which the accumulated signal charge is cleared. In this state, the barrier contact B changes to a positive potential in order to break down the potential barrier between the inner gate region IG and the clear contact CL so that the clear contact CL can remove by suction the signal electrons accumulated in the inner gate region IG and as a result can clear the semiconductor detector.

Figure 3:
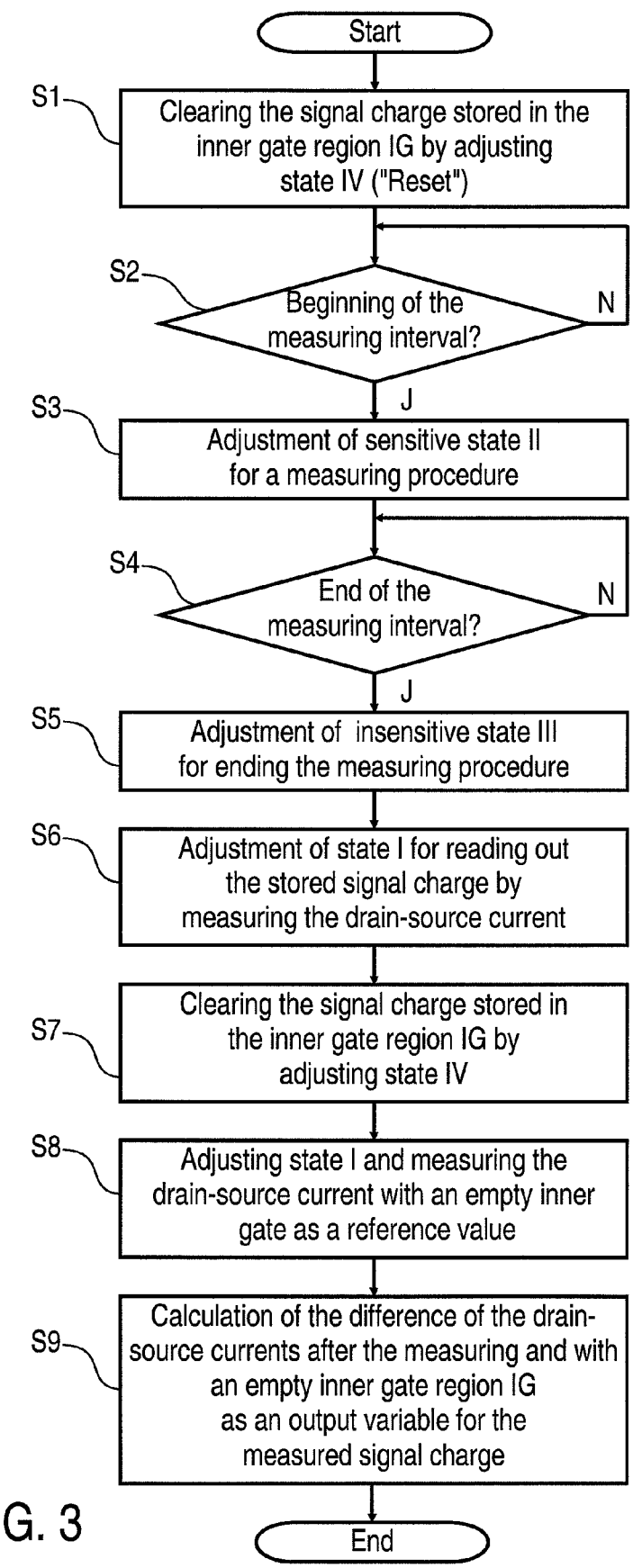
FIG. 3 shows the operating method in accordance with the invention in the form of a flow chart.

FIG. 3 shows an exemplary embodiment of an operating method in accordance with the invention for the previously described semiconductor detector in accordance with the invention. This operating method is especially advantageously suited for the detection of short radiation events whose point in time is known in advance, as is the case, e.g., in experiments with particle accelerators.

In a first step S1 the previously described state IV. is adjusted initially in which the signal charges stored in the inner gate region IG are cleared.

Subsequently, a running check is made in a further step S2 whether the measuring interval of interest has started and state IV. is retained up to the beginning of the measuring interval.

Then, at the beginning of the measuring interval of interest the previously described sensitive state II. of the semiconductor detector is adjusted in step S3 in which the incident radiation generates signal electrons which accumulate in the inner gate region IG.

A running check is made thereby in a further step S4 whether the end of the measuring interval of interest has been reached.

Then, at the end of the measuring interval of interest the previously described insensitive state III. of the semiconductor detector and in accordance with the invention is adjusted in which the incident radiation still generates signal electrons in the semiconductor body HK which are, however, removed by suction from the clear contact CL and therefore do not pass into the inner gate region IG.

Subsequently, the previously described state I. is then adjusted in a further step S6 in which the signal charge accumulated in the inner gate region IG is read out, during which the drain-source current is measured.

Subsequently, a clearing of the signal charge stored in the inner gate region IG then takes place in a further step S7 by adjusting the previously explained state IV. in which the clear contact CL removes by suction the signal electrons accumulated in the inner gate region IG.

After this clearing the previously described state I. is again adjusted in a step S8 and a new measuring of the drain-source current takes place with the inner gate region IG being empty.

Finally, in a last step S9 the difference between the two measured drain-source currents is calculated that forms a measure for the incident radiation during the measuring interval of interest.

Figure 4A:
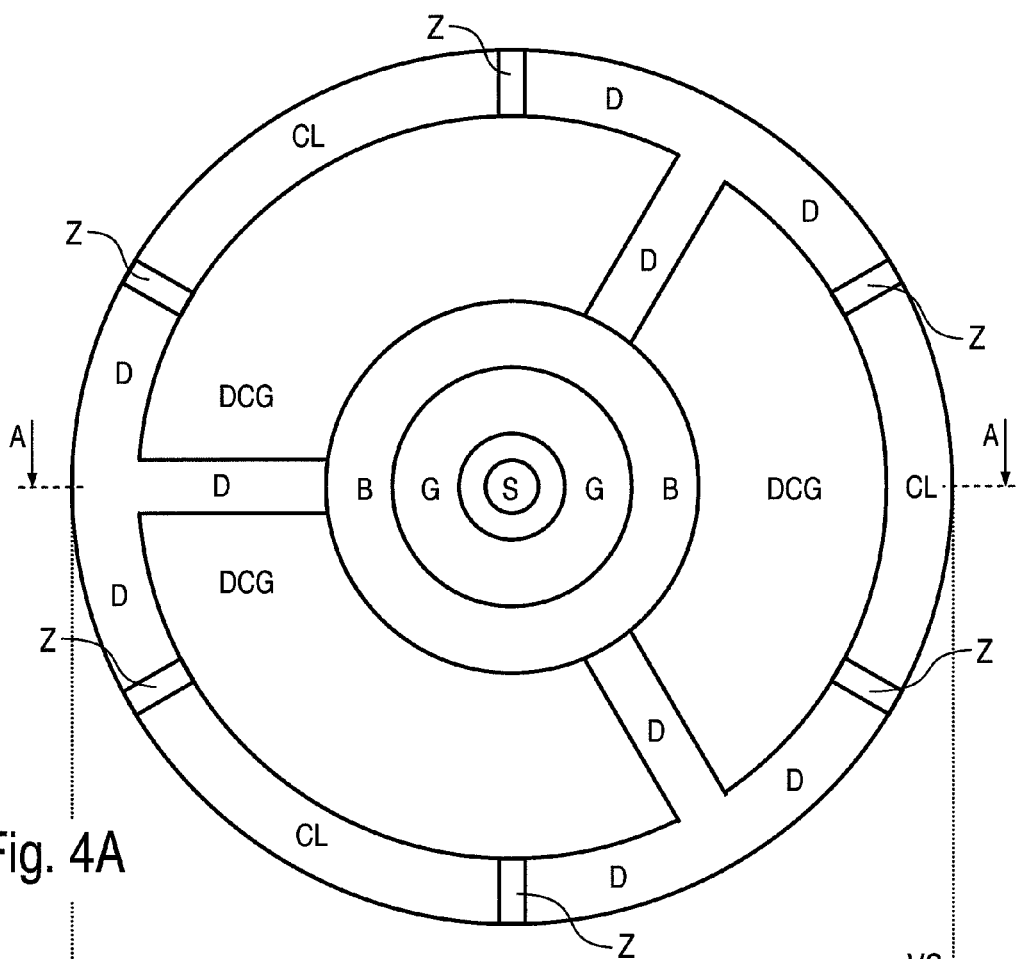
FIG. 4A shows a top view of a modified exemplary embodiment of a semiconductor detector in accordance with the invention and FIG. 4B shows a cross-sectional view of the exemplary embodiment according to FIG. 4A.
Figure 4B:
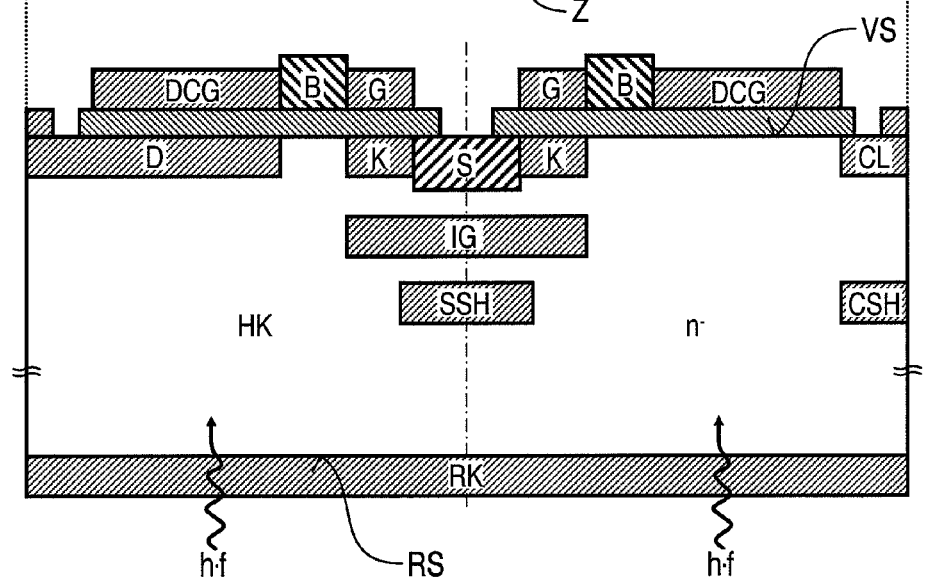

FIGS. 4A and 4B show a modification of the exemplary embodiment from FIGS. 1A and 1B wherein this exemplary embodiment largely corresponds to the previously described exemplary embodiment. Therefore, in order to avoid repetitions the previous description is extensively referred to and the same reference numerals are used for corresponding parts and zones.

A particularity of this exemplary embodiment consists in that the drain region D comprises radial extensions that run in a radial direction up to the barrier contact B.

An advantage of this arrangement consists in the fact that the collecting of additional charge can be suppressed even during the reading out (state I). In this state I., the drain-clear region DCG can also be in the positive state since the inversion layer under the barrier contact B is conductively connected to the drain region D.

The invention is not limited to the previously described preferred exemplary embodiments but rather a plurality of variants and modifications is possible that also makes use of the concept of the invention and therefore falls under its protective scope.

| List of reference numerals: | |
|---|---|
| B | barrier contact |
| CL | clear contact |
| CSH | shielding region |
| D | drain region |
| DCG | drain-clear contact |
| G | external gate region |
| HK | semiconductor body |
| IG | inner gate region |
| K | conduction channel |
| RS | back side |
| S | source region |
| SSH | shielding region |
| VS | front side |
| Z | intermediate space |

The invention claimed is:

1. A semiconductor structure comprising:
    a) a semiconductor substrate with a front side and a back side,
    b) a source region arranged on the front side of the semiconductor substrate,
    c) a drain region arranged on the front side of the semiconductor substrate,
    d) an external gate region arranged on the front side of the semiconductor substrate that serves to control a conduction channel located underneath the external gate region,
    e) an inner gate region for collecting free charge carriers that are generated in the semiconductor substrate, wherein the inner gate region is arranged in the semiconductor substrate at least partially below the external gate region in order to control the conduction channel from below as a function of the accumulated charge carriers,
    f) a clear contact for removing the accumulated charge carriers from the inner gate region,
    g) a drain-clear region that can be selectively controlled as an auxiliary clear contact or as a drain, said drain-clear region being arranged on the front side of the semiconductor substrate, and
    h) an additional barrier contact that is arranged on the front side of the semiconductor substrate in a lateral direction between the external gate region and the drain clear region in order to build up a controllable potential barrier between the inner gate region and the clear contact that prevents the charge carriers accumulated in the inner gate region from being removed by suction from the clear contact.

2. The semiconductor structure according to claim 1, wherein the source region is surrounded by the external gate region and the inner gate region arranged underneath the external gated region.

3. The semiconductor structure according to claim 2, wherein the drain region is connected in an electrically conductive manner at at least one location to a region under the barrier contact.

4. The semiconductor structure according to claim 1, wherein the external gate region is surrounded by the barrier contact.

5. The semiconductor structure according to claim 1, wherein the barrier contact is surrounded by the drain clear region.

6. The semiconductor structure according to claim 1, wherein the clear contact and the drain region are alternately arranged in an outer region of the semiconductor structure.

7. The semiconductor structure according to claim 6, wherein intermediate spaces are arranged between adjacent zones of the clear contact and of the drain region in order to avoid field strength peaks.

8. The semiconductor structure according to claim 1, further comprising a first shielding region arranged in the semiconductor substrate at least partially under the inner gate region.

9. The semiconductor structure according to claim 1, further comprising a first shielding region arranged in the semiconductor substrate at least partially under the inner gate region and under the source region.

10. The semiconductor structure according to claim 9, wherein the first shielding region only partially covers the inner gate region in the lateral direction.

11. The semiconductor structure according to claim 9, further comprising a second shielding region arranged in the semiconductor substrate at least partially under the clear contact.

12. The semiconductor structure according to claim 11, wherein:
    a) the semiconductor substrate is weakly doped in accordance with a first doping type,
    b) the drain region is highly doped according to a second doping type,
    c) the source region is highly doped according to the second doping type,
    d) the inner gate region is doped according to the first doping type,
    e) the clear contact is arranged on the front side of the semiconductor substrate and is highly doped according to the first doping type,
    f) the first shielding region is doped according to the second doping type,
    g) the second shielding region is doped according to the second doping type, and h) a region of the second doping type is arranged on the back side of the semiconductor substrate in order to deplete the semiconductor substrate.

13. The semiconductor structure according to claim 12, wherein the first doping type is n-doped, and the second doping type is p-doped.

14. semiconductor structure according to claim 12, wherein the first doping type is p-doped, and the second doping type is n-doped.

15. The semiconductor structure according to claim 1, wherein the semiconductor substrate is silicon.

16. The semiconductor structure according to claim 1, wherein the drain clear region, the barrier contact and the external gate region comprise at least partially a material selected from the group consisting of:

a) metal, and b) polysilicon.

17. A semiconductor detector comprising a semiconductor structure according to claim 1.

* * * * *